US008970053B2

(12) United States Patent
Wang et al.

(10) Patent No.: US 8,970,053 B2
(45) Date of Patent: Mar. 3, 2015

(54) SEMICONDUCTOR PACKAGE HAVING LIGHT-EMITTING-DIODE SOLDER-BONDED ON FIRST AND SECOND CONDUCTIVE PADS SEPARATED BY AT LEAST 75 UM

(75) Inventors: Yuen-Han Wang, Taichung Hsien (TW); Sheng-Li Lu, Taichung Hsien (TW); Jih-Fu Wang, Taichung-Hsien (TW); Hsien-Wen Chen, Taichung Hsien (TW); Kuan-Yu Yang, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 308 days.

(21) Appl. No.: 13/483,247

(22) Filed: May 30, 2012

(65) Prior Publication Data
US 2013/0214310 A1    Aug. 22, 2013

(30) Foreign Application Priority Data
Feb. 16, 2012  (TW) .............................. 101105025 A

(51) Int. Cl.
*H01L 33/00*       (2010.01)

(52) U.S. Cl.
USPC ........................................... 257/778; 438/612

(58) Field of Classification Search
CPC ........ H01L 24/12; H01L 33/62; H01L 33/486
USPC ................................... 257/778; 438/108, 612
See application file for complete search history.

(56) References Cited

U.S. PATENT DOCUMENTS

| 2004/0140562 A1* | 7/2004 | Farrar ............................ 257/738 |
| 2004/0203189 A1* | 10/2004 | Chen et al. .................... 438/108 |
| 2005/0006754 A1* | 1/2005 | Arik et al. ..................... 257/712 |

* cited by examiner

*Primary Examiner* — Thomas L Dickey
(74) *Attorney, Agent, or Firm* — Mintz Levin Cohn Ferris Glovsky and Popeo, P.C.; Peter F. Corless; Steven M. Jensen

(57) ABSTRACT

A semiconductor package and a fabrication method thereof are disclosed, which is characterized in that a solder material is used to bond an LED chip and a substrate so as to provide a thick joint between the substrate and the LED chip and hence reduce stresses generated between the LED chip and the substrate due to their CTE mismatch, thereby preventing delamination from occurring between the LED chip and the substrate after a reliability test.

20 Claims, 3 Drawing Sheets

SEMICONDUCTOR PACKAGE HAVING LIGHT-EMITTING-DIODE SOLDER-BONDED ON FIRST AND SECOND CONDUCTIVE PADS SEPARATED BY AT LEAST 75 UM

CROSS-REFERENCES TO RELATED APPLICATIONS

This application claims under 35 U.S.C. §119(a) the benefit of Taiwanese Application No. 101105025, filed Feb. 16, 2012, the entire contents of which is incorporated herein by reference.

BACKGROUND OF THE INVENTION

1. Field of the Invention

The present invention relates to semiconductor packages and fabrication methods thereof, and more particularly, to a semiconductor package having an LED chip attached to a substrate and a fabrication method thereof.

2. Description of Related Art

Along with the rapid development of electronic industries, electronic products are becoming lighter, thinner, shorter and smaller and developed towards high performance, high functionality and high speed. Therein, LEDs (Light Emitting Diodes) have been widely applied in electronic products having lighting requirements since the LEDs have advantages of long lifetime, small size, high shock resistance and low power consumption.

A flip-chip type LED chip is usually mounted on a carrier through eutectic bonding or direct bonding, which is referred to as a die attachment process. Au—Sn eutectic bonding is generally used in a die attachment process. Therein, an Au—Sn alloy is formed on a bottom surface of an LED chip as a solder material. Then, the LED chip is mounted on a substrate plated with Au or Ag. Thereafter, the substrate with the chip is heated to an eutectic temperature so as for Au or Ag on the substrate and the Au—Sn alloy to diffuse mutually into each other, thereby changing the composition of the alloy. Next, the eutectic structure is solidified such that the die attachment process is completed. In this manner, the eutectic structure between the LED chip and the substrate has a thickness of about 3 to 5 um, as shown in FIG. 1.

FIG. 1 is a cross-sectional view of a conventional semiconductor package 1. Referring to FIG. 1, an LED chip 13 is mounted on a substrate 10. The substrate 10 has a base layer 101, an insulating layer 102 formed on the base layer 101 and a metal layer 103 formed on the insulating layer 102. The metal layer 103 has a plurality of circuits (not shown), reflective portions 103c, a first conductive pad 103a and a second conductive pad 103b. Further, a first surface treatment layer 11a is formed on the reflective portions 103c, and a second surface treatment layer 11b is formed on the circuits and the first and second conductive pads 103a, 103b. Furthermore, a first reflective layer 12a is formed on the first surface treatment layer 11a. The first surface treatment layer 11a is made of Ni, the second treatment layer 11b has a lower layer made of Ni and an upper layer made of Au or Ag, and the first reflective layer 12a is made of Ag or white paint.

The LED chip 13 has a first electrode pad 131 and a second electrode pad 132. A second reflective layer 12b made of such as Ag or Al is formed on the first electrode pad 131, and a bonding material 130 made of Au—Sn is further formed on the second reflective layer 12b and the second electrode pad 132.

Therefore, the LED chip 13 is mounted on and eutectically bounded to the substrate 10 with the first and second electrode pads 131, 132 of the LED chip 13 coupled to the first and second conductive pads 103a, 103b, respectively, via the bounding material. And the bonding material is 130 bonded to the second surface treatment layer 11b through eutectic bonding, thereby obtaining the semiconductor package 1 with a preferred thermal conductive effect.

However, since the eutectic bonding structure T, i.e., the joint between the bonding material 130 and the second surface treatment layer 11b, has a relatively small thickness of about 3 to 5 um, a large stress can be generated between the LED chip 13 and the substrate 10 due to their CTE (Coefficient of Thermal Expansion) mismatch. Therefore, after the semiconductor package 1 undergoes a reliability test, delamination can easily occur between the LED chip 13 and the substrate 10.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package and a fabrication method thereof so as to prevent delamination from occurring between an LED chip and a substrate, thereby achieving a preferred product reliability.

The present invention provides a semiconductor package, which comprises: a substrate having a first conductive pad and a second conductive pad; a solder material formed on the first and second conductive pads and having a thickness of 5 to 40 um; and an LED chip having a first electrode pad and a second electrode pad bonded and attached to the substrate via the solder material by bonding the first electrode pad and the second electrode pat to the first and second conductive pads, respectively.

The present invention further provides a fabrication method of a semiconductor package, which comprises the steps of: forming a solder material on a first conductive pad and a second conductive pad of a substrate; and attaching an LED chip having a first electrode pad and a second electrode pad to the substrate by bonding via the solder material the first and second electrode pads to the first and second conductive pads, respectively, wherein the solder material has a thickness of 5 to 40 um.

In the above-described package and method, the substrate can have a plurality of reflective portions and circuits. The substrate can comprise a base layer, an insulating layer formed on the base layer, and a metal layer formed on the insulating layer. Therein, the metal layer comprises the reflective portions, the circuits and the first and second conductive pads.

In the above-described package and method, a reflective layer can be formed over the reflective portions, and a surface treatment layer can be formed between the reflective portions and the reflective layer. Further, a surface treatment layer can be formed between the first conductive pad and the solder material and between the second conductive pad and the solder material.

In the above-described package and method, the distance between the solder material on the first conductive pad and the solder material on the second conductive pad can be at least 75 um, and preferably, the solder material can have a thickness of 5 to 20 um.

In the above-described package and method, a first reflective layer can be formed on the first electrode pad.

In the above-described package and method, a bonding material can be formed on the first and second electrode pads for being bonded with the solder material, and the bonding material can be made of Au—Sn, Au or Ag.

According to the present invention, a solder material is formed between the LED chip and the substrate so as to provide a thick joint between the LED chip and the substrate and hence reduce stresses generated between the LED chip and the substrate due to their CTE mismatch, thereby preventing delamination from occurring between the LED chip and the substrate after a reliability test. As such, the reliability of the semiconductor package is improved.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "top", "bottom" etc. are merely for illustrative purpose and should not be construed to limit the scope of the present invention.

Figure 1:
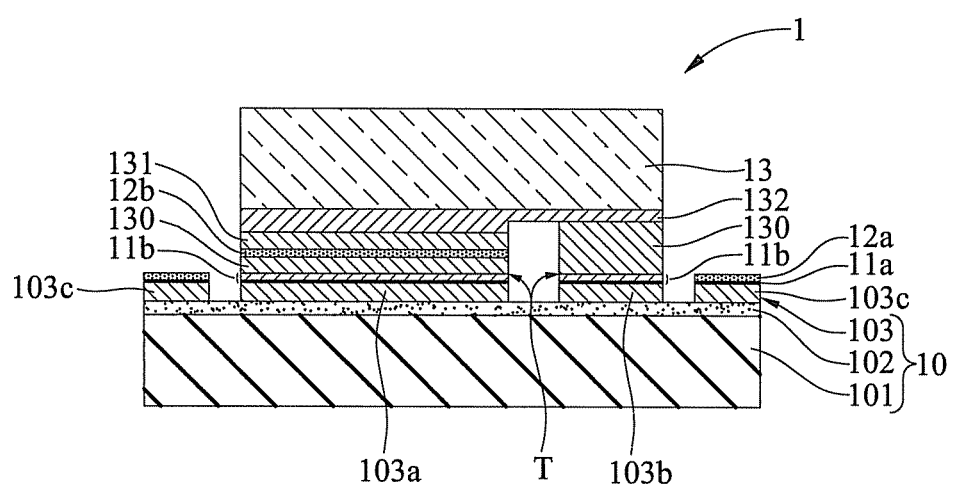
FIG. 1 is a schematic cross-sectional view of a conventional semiconductor package.
Figure 2A:
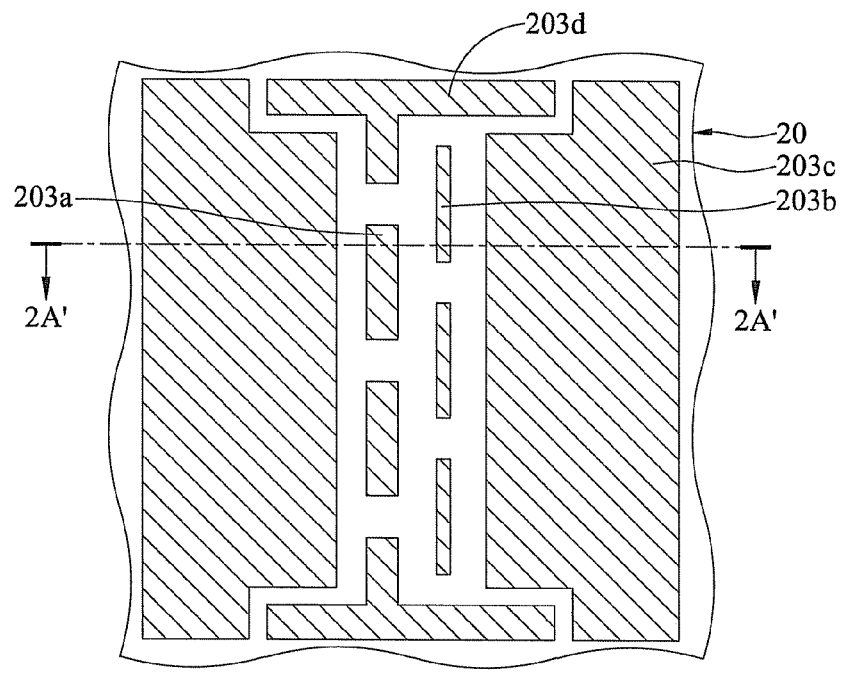
FIGS. 2A and 2B are schematic top views showing a fabrication method of a semiconductor package according to the present invention, wherein FIGS. 2A' and 2B' are schematic cross-sectional views of FIGS. 2A and 2B, respectively.
Figure 2A:
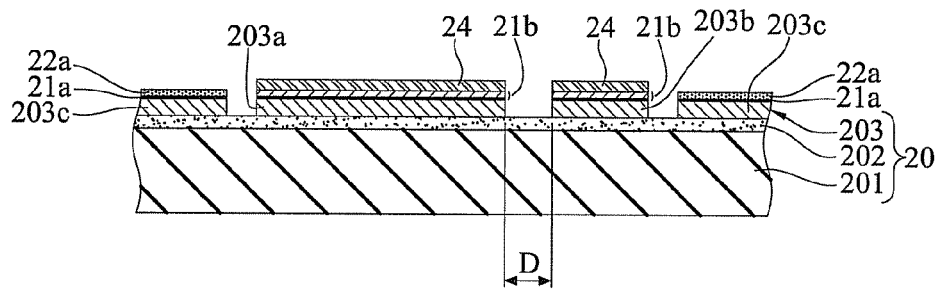
Figure 2B:
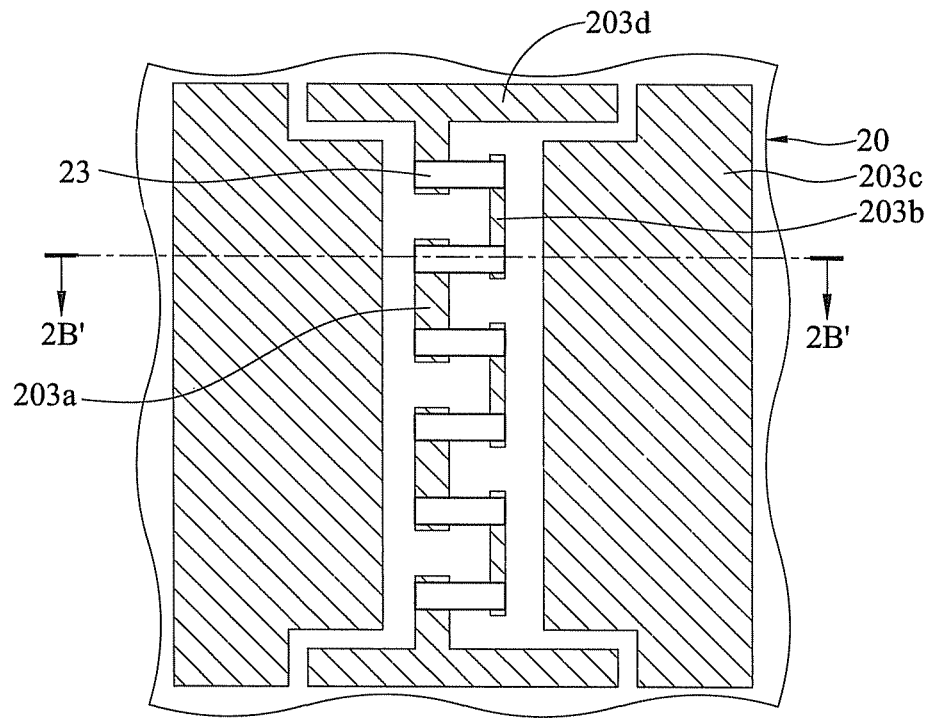
Figure 2B:
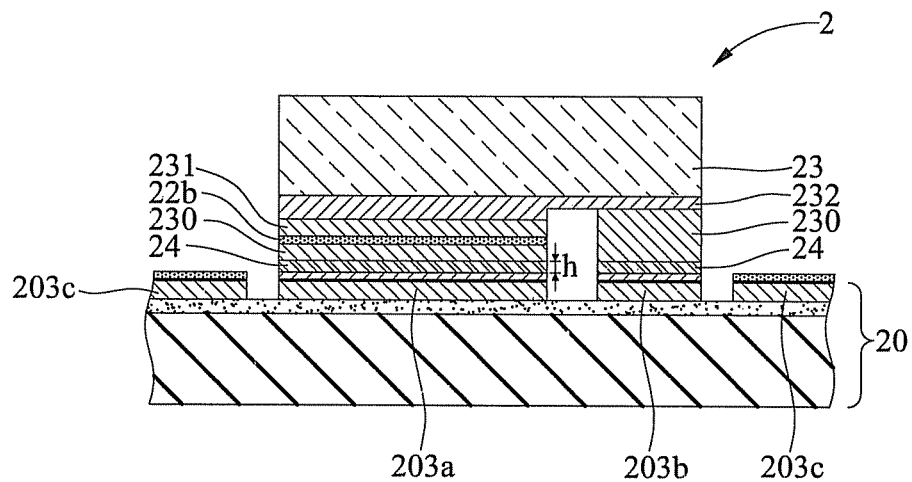

FIGS. 2A and 2B are schematic top views showing a fabrication method of a semiconductor package 2 according to the present invention. Therein, FIG. 2A' is a cross-sectional view along a line 2A'-2A' of FIG. 2A and FIG. 2B' is a cross-sectional view along a line 2B'-2B' of FIG. 2B.

Referring to FIGS. 2A and 2A', a substrate 20 having a plurality of reflective portions 203c, circuits 203d, first conductive pads 203a and second conductive pads 203b is provided. Therein, the circuits 203d electrically connect the first and second conductive pads 203a, 203b, and the reflective portions 203c and the circuits 203d are formed at an outer periphery of the first and second conductive pads 203a, 203b.

Then, a first surface treatment layer 21a is formed on the reflective portions 203c, and a second surface treatment layer 21b is formed on the circuits 203d and the first and second conductive pads 203a, 203b.

A first reflective layer 22a is formed on the first surface treatment layer 21a, and a solder material 24 is formed on the second surface treatment layer 21b by stencil printing. Based on the reflective portions 203c at the outer periphery of the first and second conductive pads 203a, 203b, the first reflective layer 22a has a reflective function.

In the present embodiment, the substrate 20 is an MCPCB (Metal Core PCB), which has a base layer 201 made of Al, an insulating layer 202 formed on the base layer 201 and a metal layer 203 such as a copper layer formed on the insulating layer 202. Further, the metal layer 203 is patterned to form the reflective portions 203c, the circuits 203d and the first and second conductive pads 203a, 203b, as shown in FIG. 2A'.

The first surface treatment layer 21a is made of Ni, the second treatment layer 21b has a lower layer made of Ni and an upper layer made of Au or Ag, and the first reflective layer 22a is made of Ag or white paint.

The solder material 24 can be a solder paste, and the distance D between the solder material 24 on the first conductive pads 203a and the solder material 24 on the second conductive pads 203b is at least 75 um.

Referring to FIGS. 2B and 2B', a plurality of LED chips 23 are provided. Each of the LED chips 23 has a first electrode pad 231 and a second electrode pad 232, and a second reflective layer 22b made of such as Ag or Al is formed on the first electrode pad 231.

Then, a bonding material 230 is formed on the second reflective layer 22b and the second electrode pad 232. The bonding material 230 can be made of Au—Sn, Au or Ag.

Subsequently, the bonding material 230 is bonded to the solder material 24 and further the solder material 24 is reflowed so as to attach the LED chips 23 to the substrate 20 with the first and second electrode pads 231, 232 bonded to the first and second conductive pads 203a, 203b, respectively.

In the present embodiment, for each of the LED chips 23, the first electrode pad 231 is a p-electrode and the second electrode pad 232 is an n-electrode, and the first and second electrode pads 231, 232 are made of GaN.

Furthermore, the reflowed solder material 24 has a thickness h of 5 to 40 um. Preferably, the reflowed solder material 24 has a thickness h of 5 to 20 um.

The semiconductor package 2 is fabricated through a printing process. Therein, a conductive material such as a solder material 24 is applied on the first and second conductive pads 203a, 203b of the MCPCB substrate 20, and the LED chips 23 are flip-chip mounted on the substrate 20 with the first and second electrode pads 231, 232 bonded to the first and second conductive pads 203a, 203b, respectively.

When the solder material 24 has a thickness h of 5 to 40 um which does not significantly affect the thermal conductivity, the stresses generated between the LED chips 23 and the substrate 20 due to their CTE mismatch is quite small. That is, the present invention achieves a balance between the thermal conductive effect and the stress affect. Preferably, the solder material 24 has a thickness of 5 to 20 um. As such, delamination will not occur between the LED chips 23 and the substrate 20 after a reliability test.

The present invention provides a semiconductor package 2, which has: a substrate 20, at least an LED chip 23 and a solder material 24 for bonding the substrate 20 and the LED chip 23.

The substrate 20 has a plurality of reflective portions 203c, circuits 203d, a first conductive pad 203a and a second conductive pad 203b. Therein, the substrate 20 is a MCPCB. The substrate 20 has a base layer 201, an insulating layer 202 formed on the base layer 201, and a metal layer 203 formed on the insulating layer 202. The metal layer 203 has the reflective portions 203c, the circuits 203 and the first and second conductive pads 203a, 203b.

A first surface treatment layer 21a and a first reflective layer 22a are sequentially formed on the reflective portions 203c, and a second surface treatment layer 21b is formed on the circuits 203d and the first and second conductive pads 203a, 203b.

The solder material 24 having a thickness of 5 to 40 um is formed on the second surface treatment layer 21b. The distance D between the solder material 24 on the first conductive pad 203a and the solder material 24 on the second conductive pad 203b is at least 75 um.

The LED chip 23 has a first electrode pad 231 and a second electrode pad 232 bonded to the solder material 24 on the first and second conductive pads 203a, 203b, respectively, so as for the LED chip 23 to be attached to the substrate 20. Further, a second reflective layer 22b is formed on the first electrode pad 231, and a bonding material 230 is formed on the second reflective layer 22b and the second electrode pad 232 for bonding with the solder material 24. Therein, the solder material 230 is made of Au—Sn, Au or Ag.

According to the present invention, a solder material is used to bond the LED chip and the substrate so as to provide a thick joint between the LED chip and the substrate while meeting the thermal conductive function. As such, stresses generated between the LED chip and the substrate due to their CTE mismatch are reduced so as to prevent delamination from occurring between the LED chip and the substrate after a reliability test, thereby improving the reliability of the semiconductor package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a substrate having a first conductive pad and a second conductive pad;
   a solder material formed on the first and second conductive pads and having a thickness of 5 to 40 um, wherein a distance between the solder material on the first conductive pad and the solder material on the second conductive pad is at least 75 um; and
   an Light-Emitting-Diode(LED) chip having a first electrode pad and a second electrode pad and attached to the substrate by bonding via the solder material the first electrode pad and second electrode pad to the first and second conductive pads, respectively.

2. The package of claim 1, wherein the substrate has a plurality of reflective portions and circuits.

3. The package of claim 2, wherein the substrate comprises a base layer, an insulating layer formed on the base layer, and a metal layer formed on the insulating layer, wherein the metal layer comprises the reflective portions, the circuits and the first and second conductive pads.

4. The package of claim 2, wherein a reflective layer is formed over the reflective portions.

5. The package of claim 4, wherein a surface treatment layer is formed between the reflective portions and the reflective layer.

6. The package of claim 1, wherein a surface treatment layer is formed between the first conductive pad and the solder material and between the second conductive pad and the solder material.

7. The package of claim 1, wherein the solder material has a thickness of 5 to 20 um.

8. The package of claim 1, wherein a reflective layer is formed on the first electrode pad.

9. The package of claim 1, wherein a bonding material is formed on the first and second electrode pads for being bonded with the solder material.

10. The package of claim 9, wherein the bonding material is made of Au—Sn, Au or Ag.

11. A fabrication method of a semiconductor package, comprising the steps of:
    forming a solder material on a first conductive pad and a second conductive pad of a substrate, wherein a distance between the solder material on the first conductive pad and the solder material on the second conductive pad is at least 75 um; and
    attaching an LED chip having a first electrode pad and a second electrode pad to the substrate with the first and second electrode pads bonded to the solder material on the first and second conductive pads, respectively, via the solder material, wherein the solder material has a thickness of 5 to 40 um.

12. The method of claim 11, wherein the substrate has a plurality of reflective portions and circuits.

13. The method of claim 12, wherein the substrate comprises a base layer, an insulating layer formed on the base layer, and a metal layer formed on the insulating layer, wherein the metal layer comprises the reflective portions, the circuits and the first and second conductive pads.

14. The method of claim 12, wherein a reflective layer is formed over the reflective portions.

15. The method of claim 14, wherein a surface treatment layer is formed between the reflective portions and the reflective layer.

16. The method of claim 11, wherein a surface treatment layer is formed between the first conductive pad and the solder material and between the second conductive pad and the solder material.

17. The method of claim 11, wherein the solder material has a thickness of 5 to 20 um.

18. The method of claim 11, wherein a reflective layer is formed on the first electrode pad.

19. The method of claim 11, wherein a bonding material is formed on the first and second electrode pads being bonded with the solder material.

20. The method of claim 19, wherein the bonding material is made of Au—Sn, Au or Ag.

* * * * *